United States Patent [19]
Hoshino et al.

[11] Patent Number: 6,114,764
[45] Date of Patent: Sep. 5, 2000

[54] SEMICONDUCTOR DEVICE AND PROCESS FOR FABRICATING THE SAME

[75] Inventors: Kazuhiro Hoshino; Takaaki Miyamoto, both of Kanagawa, Japan

[73] Assignee: Sony Corporation, Tokyo, Japan

[21] Appl. No.: 08/745,305

[22] Filed: Nov. 12, 1996

Related U.S. Application Data

[63] Continuation of application No. 08/337,485, Nov. 8, 1994, abandoned.

[30] Foreign Application Priority Data

Nov. 8, 1993 [JP] Japan .................................. 5-302344

[51] Int. Cl.$^7$ .................................................. H01L 29/43
[52] U.S. Cl. .......................... 257/751; 257/915; 257/763; 257/767
[58] Field of Search ..................................... 438/688, 627, 438/628, 648, 653, 654, 658, 660; 257/751, 763, 767, 915

[56] References Cited

U.S. PATENT DOCUMENTS

| | | |
|---|---|---|
| 5,187,561 | 2/1993 | Hasunuma et al. . |
| 5,296,404 | 3/1994 | Akahori et al. . |
| 5,343,044 | 8/1994 | Nulman et al. .......................... 437/192 |
| 5,360,996 | 11/1994 | Nulman et al. . |
| 5,572,071 | 11/1996 | Lee . |
| 5,723,367 | 3/1998 | Wada et al. . |

FOREIGN PATENT DOCUMENTS 6-260445  9/1994  Japan .

OTHER PUBLICATIONS

Hisako Ono, et al. "Development of a Planarized Al–Si Contact Filling Technology" Proc. 7th International IEEE VLSI Multilevel Interconnect. Conf. (Jun. 12–13, 1990) Calif pp. 76–82.

G. A. Dixit, et al. "A Novel 0.25 mu: via plug process using low temp. CVD Al/TiN" Int. Electron. Dev. Meeting Tech. Dig. IEEE Conf. Wash. DC. (Dec. 10–13, 1995) pp. 1001–1004. Abstract only.

Hisako Ono, et al. "Development of a Planarized Al–Si Contact Filling Technology" Proc. 7th International IEEE VLSI Multilevel Interconnect. Conf. (Jun. 1990) pp. 77–81. (abstract).

Kaizuka, T., et al. "Conformal CVD TiN film formation as an underlayer of Al . . . " Japanese J. of Appl. Phys. (Pt. I) (Jan. 1994) V.33 No. 1B p 470–4.

*Primary Examiner*—Caridad Everhart
*Attorney, Agent, or Firm*—Hill & Simpson

[57] ABSTRACT

A semiconductor device, comprising: an insulating layer formed on a semiconductor body; a barrier metal layer comprising titanium nitride formed on the insulating layer; and a n aluminum based alloy layer formed on the barrier metal layer, provided that the aluminum based alloy crystals constituting the aluminum based alloy layer have the crystallographic <111> axis thereof inclined by an angle of from 0 to 5 degrees with respect to the normal of the barrier metal layer on the insulating layer. Also claimed is a process for fabricating the semiconductor device.

6 Claims, 7 Drawing Sheets

SEMICONDUCTOR DEVICE AND PROCESS FOR FABRICATING THE SAME

This is a continuation, of application Ser. No. 08/337,485, filed Nov. 8, 1994 now abandoned.

BACKGROUND OF THE INVENTION

The present invention relates to a semiconductor device, and to a process for fabricating a semiconductor device, comprising a step of forming a barrier metal layer by means of chemical vapor deposition (CVD).

In general, a large number of connection holes are necessary in a semiconductor device. The term "connection holes" as used herein refers collectively to contact holes, through holes, and via holes. These connection holes are commonly formed by, for instance, fabricating an insulating layer on a semiconductor body (referred to simply hereinafter as "a base") comprising a semiconductor substrate having thereon a lower conductive layer such as an impurity diffusion layer, etc., and then, after providing an opening to the insulating layer, filling the opening with a metallic interconnection material. With increasing level of integration in the semiconductor devices, however, a finer design rule is required. Hence, the development of a technology for filling an opening having a still higher aspect ratio with a metallic interconnection material is keenly demanded.

In a state-of-the-art technology, an opening is filled by depositing an aluminum based alloy by means of sputtering. The term "an aluminum based alloy" as referred herein encompasses pure aluminum and other aluminum alloys. In the deposition using sputtering, the destruction of the lower conductive layer due to the generation of silicon nodules and aluminum spikes is prevented from occurring by first forming a barrier metal layer utilizing titanium nitride (TiN) and the like, and then forming an aluminum based alloy layer on the resulting barrier metal layer.

In case of utilizing sputtering for the deposition, however, because of the so-called "shadowing effect", it can be seen that the deposition of the sputtered aluminum based alloy or TiN on the bottom portion of the opening or onto the side walls in the vicinity thereof becomes more difficult with increasing aspect ratio of the opening. The so-called "shadowing effect" refers to the particular phenomenon which occurs during sputtering. More specifically, the sputtered particles tend to deposit only on optically bright portions while leaving over the shadow portions corresponding to the side walls or the bottom portions of the openings uncovered by the sputtered material. The structure which is obtained as a consequence of the so-called shadowing effect suffers openings having a barrier metal layer with inferior step coverage or an aluminum based alloy layer deposited at poor step coverage on the bottom portions or the side walls in the vicinity thereof. Such defective portions with defective step coverage impair the barrier effect of the barrier layer or result in the generation of disconnection.

To prevent the aforementioned problems associated with the poor step coverage from occurring, a high temperature aluminum sputtering technique is proposed to increase the step coverage of the aluminum based alloy layer. More specifically, referring to the schematically drawn FIG. 7 (A), an insulating layer 14 comprising $SiO_2$ is formed on a base 10 comprising a silicon semiconductor substrate, and an opening 16 is perforated in the insulating layer 14 to expose the source/drain regions 12 formed in the base 10. Then, as shown in FIG. 7 (B), a contact layer 20 made of titanium (Ti), a barrier metal layer 22 comprising TiN, and a wettability improving layer 24 made of Ti are formed. The function of each of the contact layer 20, the barrier metal layer 22, and the wettability improving layer 24 is described hereinafter.

An aluminum based alloy layer 30 is formed thereafter on the wettability improving layer 24 employing the high temperature aluminum sputtering process. More specifically, the aluminum based alloy is deposited by sputtering onto the base (a semiconductor substrate and the like) being heated to a high temperature in the range of from about 400° C. to the melting point of the aluminum based alloy. By thus depositing the aluminum based alloy layer and maintaining it in a molten state on the barrier metal 22 formed on the insulating layer 14, the fluidized aluminum based alloy can be flown into the opening. In this manner, a connection hole 34 can be formed by filling the opening 16 with an aluminum based alloy. At the same time, the aluminum based alloy layer 30 on the insulating layer 14 is planarized to form the interconnection layer (FIG. 7 (C)).

The high temperature aluminum sputtering method as described above is certainly effective for favorably filling the opening 16 in the aluminum based alloy layer 30. However, it can be seen from FIGS. 7 (B) and 7 (C) that the step coverage of the barrier metal layer 22 and the like remains unimproved. Thus, the problems described in the foregoing, i.e., the impaired barrier effect of the barrier metal layer and the generation of defective disconnection in the barrier metal layer on the bottom portion or on the side walls in the vicinity of the bottom portion, remain unsolved.

In addition to the measure above, collimator sputtering method has been proposed recently. The newly proposed method comprises depositing the aluminum based alloy with a so-called collimator installed between the target and the base. A collimator is a plate comprising a plurality of penetrating holes. Thus, the collimator adjusts the flight of the sputtered particles from the target to the base in such a manner that the angle of incidence of the particles with respect to the base is controlled within a predetermined range. The step coverage in the bottom portion of the opening can be ameliorated in this manner. Still, this method is not always satisfactory. The low rate of film deposition and the generation of particles ascribed to the sputtered particles which adhere to the collimator are problems yet to be solved.

As another means of overcoming the aforementioned problems, there is also proposed a technique of forming a TiN film as a barrier metal layer by CVD. This method based on CVD has attracted much attention as a promising one because it can provide a conformal TiN layer having a favorable step coverage even in openings having high aspect ratio.

In case of forming an aluminum based alloy layer by high temperature aluminum sputtering on a barrier metal layer deposited by CVD, however, the following problems are found to be overcome.

The TiN crystals deposited by sputtering exhibit crystallographic (111) orientation, whereas those deposited by CVD result in (200) orientation or in random orientation. The aluminum based alloy crystals are generally oriented along the crystallographic (111) direction in such a manner that the close-packed plane may be arranged in parallel with the surface of the base. It can be seen that the TiN crystals having the (111) orientation are in good conformity with the aluminum based alloy crystals oriented along the crystallographic (111) direction. Thus, it can be seen that the (111)-oriented aluminum based alloy layer matches favorably with the underlying TiN barrier metal layer also exhibiting the (111) orientation to provide a flat and smooth aluminum based alloy layer with less surface irregularities.

In case of depositing an aluminum based alloy by high temperature aluminum sputtering on randomly oriented TiN crystals or on those oriented along the crystallographic (200) direction, on the other hand, the orientation of the aluminum based alloy is disturbed due to the lattice parameter mismatch. More specifically, the aluminum based alloy crystals tend to exhibit a weak (111) orientation. Thus, a roughened surface results on the aluminum based alloy layer (FIG. 8).

The presence of an aluminum based alloy layer having a rough surface is a great hindrance in realizing an accurate mask alignment upon forming the interconnection by applying photolithography to the interconnection layer. Furthermore, such a roughened surface of the aluminum based alloy layer brings about halation of light during the exposure of the interconnection layer in patterning the interconnection by photolithography. Even if the interconnection were to be established, the resulting aluminum based alloy layer which constitutes the interconnection suffers severe surface irregularities as to impair the process controllability in the subsequent steps of forming the interlayer insulating layers. Moreover, the resistances of the interconnection against electromigration and stress migration become inferior as to result in poor interconnection reliability.

SUMMARY OF THE INVENTION

Thus, in the light of the aforementioned circumstances, an object of the present invention is to provide a semiconductor device comprising a barrier metal having thereon an aluminum based alloy layer reduced in surface irregularities. Another object of the present invention is to provide a process for fabricating a semiconductor device by CVD. The process allows the formation of a barrier metal layer having excellent step coverage properties, and yet, it prevents surface roughening from occurring on the aluminum based alloy layer deposited on the barrier metal.

The aforementioned object of the present invention can be accomplished in one aspect by a first embodiment according to the present invention which provides a semiconductor device, comprising: an insulating layer formed on a semiconductor body; a barrier metal layer comprising titanium nitride formed on the insulating layer; and an aluminum based alloy layer formed on the barrier metal layer, provided that the aluminum based alloy crystals constituting the aluminum based alloy layer have the crystallographic <111> axis thereof inclined by an angle of from 0 to 5 degrees with respect to the normal of the barrier metal layer on the insulating layer.

The object of the present invention can be accomplished in another aspect by a second embodiment according to the present invention, which provides a semiconductor device, comprising: an insulating layer formed on a base, said insulating layer provided with an opening; a barrier metal layer comprising titanium nitride formed on the insulating layer and inside the opening; and an aluminum based alloy layer formed on the barrier metal layer, provided that the aluminum based alloy crystals constituting the aluminum based alloy layer have the crystallographic <111> axis thereof inclined by an angle of from 0 to 5 degrees with respect to the normal of the barrier metal layer on the insulating layer.

In the semiconductor device according to the first or the second embodiment of the present invention, a contact layer made of titanium is preferably formed between the insulating layer and the barrier metal layer. More preferably, a metallic layer comprising titanium is formed interposed between the barrier metal layer and the aluminum based alloy layer.

The angles which the crystallographic <111> axes of the aluminum based alloy crystals make with respect to the normal of the barrier metal layer are measured on the aluminum based alloy layer that lies on the barrier metal layer present in a region where the surface of the base is mostly in parallel with the surface of the barrier metal layer. Not all of the aluminum based alloy crystals constituting the aluminum based alloy layer necessarily be arranged in such a manner that the crystallographic <111> axes thereof are inclined by 0 to 5 degrees with respect to the normal of the barrier metal layer formed on the insulating layer, but 95% or more of the entire aluminum based alloy crystals must satisfy the condition above concerning the orientation of the crystallographic <111> axis.

The aforementioned another object of the present invention can be accomplished in one aspect by a yet other embodiment according to the present invention which provides a process for fabricating a semiconductor device, comprising: forming an insulating layer on a semiconductor body; forming a barrier metal layer comprising titanium nitride on the insulating layer by chemical vapor deposition; and forming an aluminum based alloy layer on the barrier metal layer by means of aluminum reflow process.

The object of the present invention can be accomplished in a still other aspect by a further other embodiment according to the present invention which provides a process for fabricating a semiconductor device as above, further comprising forming an opening in the insulating layer to partly expose the surface of the semiconductor body, and then forming the barrier layer on the insulating layer inclusive of that formed inside the opening.

In the process for forming the above interconnection of a semiconductor device, the barrier metal layer is formed by electron cyclotron resonance (ECR) plasma-assisted CVD or by thermal CVD. Furthermore, in the above processes, a contact layer comprising titanium can be formed after establishing the insulating layer, but before forming the barrier metal layer. In such cases, the surface oxidation of the contact layer, barrier layer, and the aluminum based alloy layer is preferably prevented from occurring by forming them under vacuum without exposing the base to the atmosphere.

The contact layer as well as the barrier metal layer can be formed by ECR plasma-assisted CVD. Otherwise, the contact layer can be deposited by sputtering while forming the barrier metal layer by thermal CVD.

The aluminum reflow process may comprise forming an aluminum based alloy layer by sputtering while maintaining the base at a temperature of 200° C. or lower, followed by heating the base to a temperature not lower then 250° C. but not higher than the melting point of aluminum. If the aluminum based alloy layer were to be formed by sputtering while maintaining the base at a temperature higher than 200° C., the aluminum based alloy crystals in the resulting aluminum based alloy layer may weakly exhibit the (111) orientation. This leads to an insufficiently suppressed surface roughening. The base can be kept at a temperature of 0° C. or lower during the sputtering step for forming the aluminum based alloy layer. The reflow treatment of the aluminum based alloy layer is not facile in case the base is heated to a temperature lower than 250° C.

Furthermore, a step of forming a metallic layer comprising titanium on the barrier metal layer can be incorporated after forming the barrier metal layer.

Because a CVD process such as ECR plasma-assisted CVD or thermal CVD enables a conformal TiN layer even in openings having high aspect ratio, a barrier metal layer with favorable step coverage can be fabricated. As described in the foregoing, the TiN barrier metal layer exhibits a (200) orientation or random orientation. If an aluminum based alloy layer is deposited thereon by sputtering while maintaining the base at a low temperature (e.g., at 200° C. or lower), the aluminum based alloy crystals tend to orient along the crystallographic (111) direction.

By heating the base at a high temperature, for instance at a temperature not lower than 250° C. but not higher than the melting point of aluminum, the aluminum based alloy layer deposited on the barrier metal layer on the insulating layer begins to melt, and the melt flows into the opening to surely fill the opening with the aluminum based alloy. Moreover, a planarized surface results on the insulating layer as to provide a flat and smoothed interconnection layer. The resulting aluminum based alloy crystals in the aluminum based alloy layer maintain the crystallographic (111) orientation. Thus, in this manner, the surface roughening of the aluminum based alloy layer can be prevented from occurring.

The crystallographic (111) orientation of the aluminum based alloy crystals in the alloy layer can be kept unchanged during the heating treatment by maintaining the base at a temperature as low as possible. More briefly, the lower the reflow temperature, the more the aluminum based alloy crystals orient along the crystallographic (111) plane. Certainly, coarser grains can be obtained with elevating temperature during crystal growth. However, a treatment at too high a temperature causes, for example, a reaction to occur between the titanium base and the aluminum based alloy layer. The local formation of a reaction product of titanium and the aluminum based alloy causes fluctuation to occur on the resistance. Thus, for the reflow treatment, the base is most preferably heated at a temperature in the range of from 400 to 450° C. If the reflow heating is effected at too high a temperature, the aluminum based alloy aggregates into an island-like portion as to impair the uniformity of the aluminum based alloy layer. Although the heating temperature in the reflow treatment depend on the fluidity of the aluminum based alloy and the surface roughness of the aluminum based alloy layer, it is preferably set as low as possible to minimize the reaction between the aluminum based alloy and, for example, the underlying titanium.

An aluminum based alloy layer composed of aluminum based alloy crystals having the crystallographic <111> axes tilted by an angle of from 0 to 5 degrees with respect to the normal of the barrier metal layer can be obtained in this manner. Surface roughening of the aluminum based alloy layer can be prevented from occurring by forming the aluminum based alloy layer in this particular manner.

DESCRIPTION OF THE PREFERRED EMBODIMENT

The present invention is described in further detail below referring to the preferred embodiments according to the present invention. It should be understood, however, that the present invention is not to be construed as being limited to the examples below.

EXAMPLE 1

The present example refers to a semiconductor device according to a first embodiment of the present invention. The present example also refers to a process for fabricating a semiconductor device according to another embodiment of the present invention. The barrier metal layer is formed by means of ECR plasma-assisted CVD. The process in the present example includes a step of forming a titanium contact layer by ECR plasma-assisted CVD before depositing the barrier metal layer.

Figure 1A:
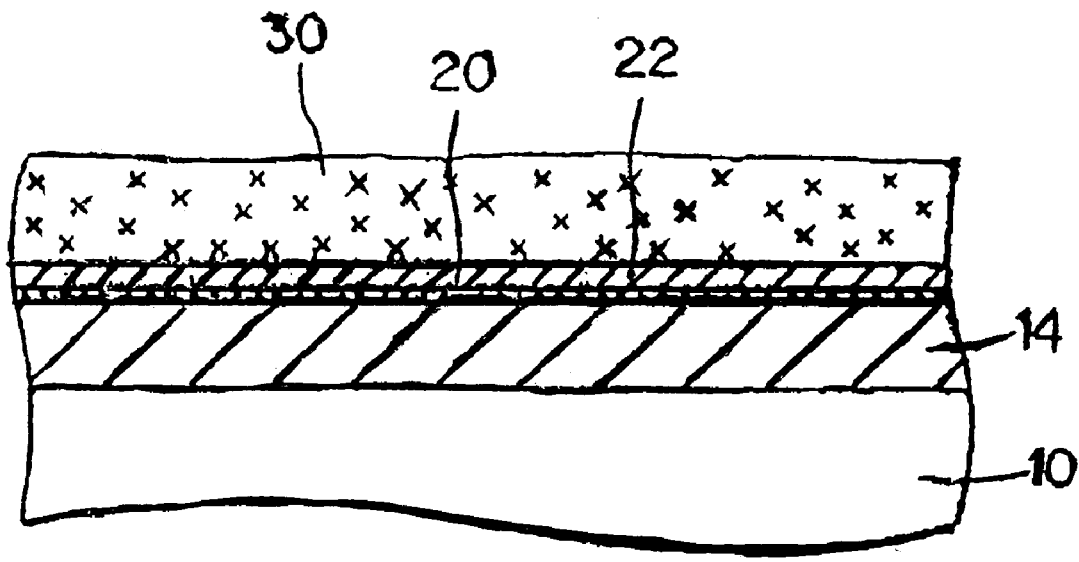
FIGS. 1 (A) and 1 (B) are schematically drawn partial cross section views of a semiconductor device of Example 1 according to an embodiment of the present invention.
Figure 1B:
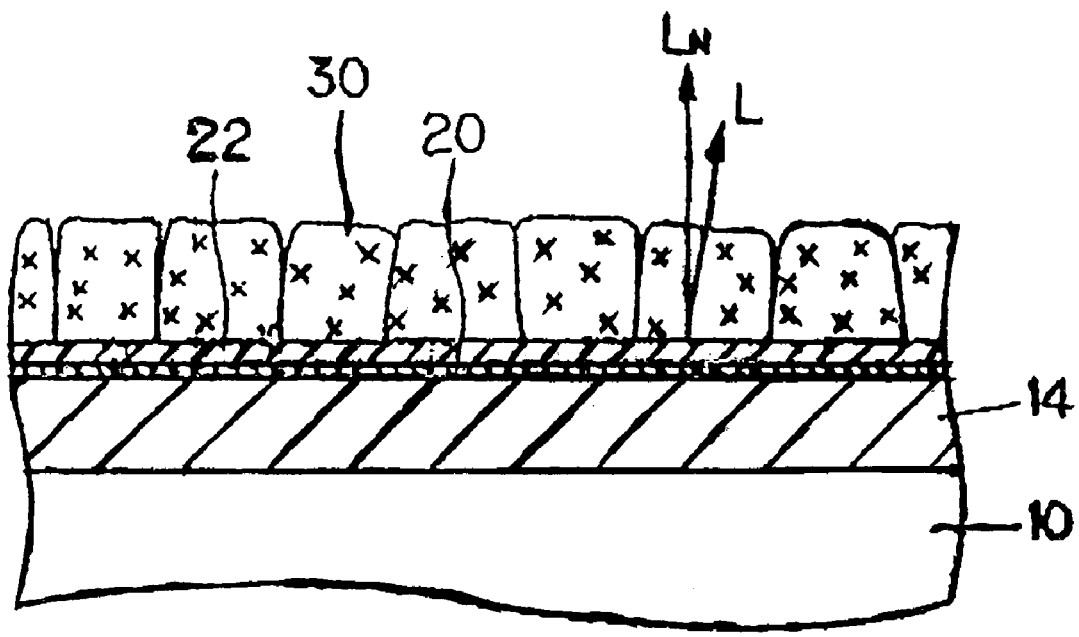

Referring to FIG. 1 (A), the semiconductor device according to the present Example comprises a base 10 having thereon an insulating layer 14, formed further thereon a barrier metal layer 22 comprising TiN and an aluminum based alloy layer 30 in this order. The aluminum based alloy layer is sometimes referred to simply hereinafter as "Al-based alloy layer". A schematically drawn enlarged view of the Al-based alloy layer 30 is shown in FIG. 1 (B). It can be seen that the crystallographic <111> axes L of the Al-based alloy crystals constituting the Al-based alloy layer 30 make an angle in the range of from 0 to 5 degrees with respect to the normal $L_N$ of the barrier metal layer 22 formed on the insulating layer 14. A contact layer 20 comprising titanium is also incorporated in the structure shown in FIGS. 1 (A) and 1 (B).

Figure 2A:
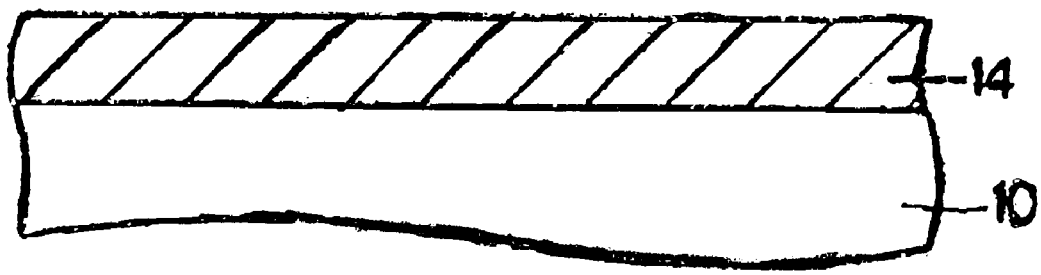
FIGS. 2 (A) to 2 (C) are a schematically drawn diagram provided as an explanatory means to show the step sequential structures of a semiconductor element obtained in the process for forming a semiconductor device of Example 1 according to another embodiment of the present invention.
Figure 2B:
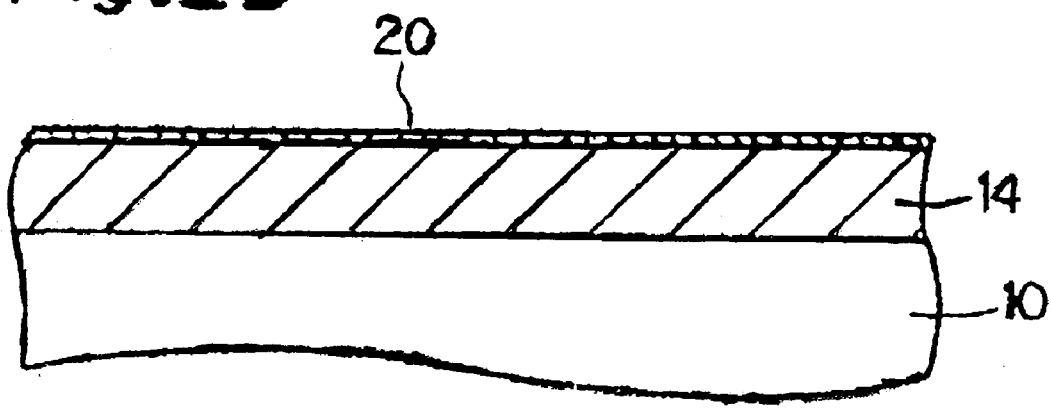
Figure 2C:
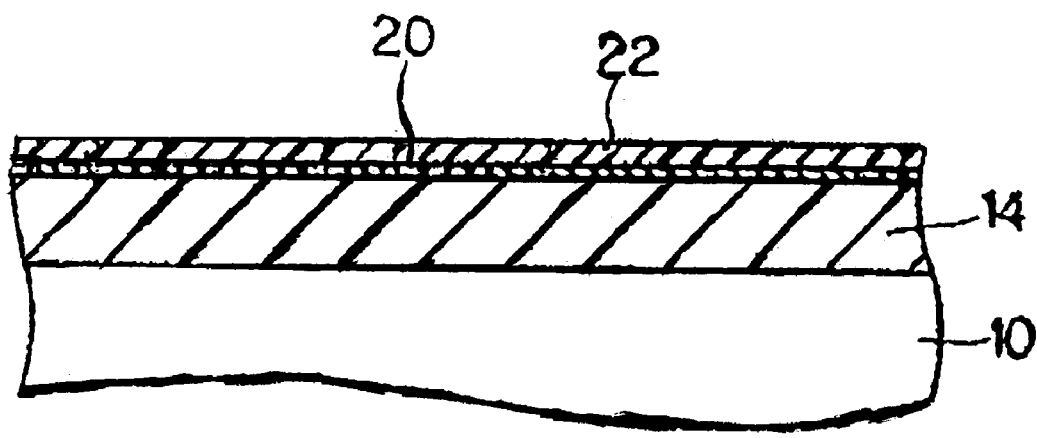

Referring to FIGS. 2 (A) to 2 (C), the process for forming the semiconductor device according to Example 1 is described below.

A 0.7 μm thick $SiO_2$ film is formed as an insulating layer 14 by an ordinary CVD process on a base 10 made of a Si (111) semiconductor substrate (FIG. 2 (A)).

A 5 nm thick titanium contact layer 20 is preferably deposited thereafter by ECR plasma-assisted CVD on the insulating layer 14 (FIG. 2 (B)). The contact layer 20 is deposited using a mixed gas of $TiCl_4$ and $H_2$ at a flow ratio of the former to the latter of 0.4 or higher at a deposition temperature of 420° C., while applying a microwave power of 2.8 kW. The contact layer 20 deposited in this manner reduces the contact resistance between the Al-based alloy layer inside the opening (not shown in the figure) and the impurity diffusion region (not shown in the figure) which are formed in the later step at a region other than the insulating layer 14.

Subsequently, a 40 nm thick TiN barrier metal layer 22 is deposited by ECR plasma-assisted CVD on the contact layer 20 without exposing the base to the atmosphere (FIG. 2 (C)). The barrier metal layer 22 can be deposited by effecting the ECR plasma-assisted CVD using a 3:4:1 mixture of gaseous $TiCl_4$, $H_2$, and $N_2$ while maintaining the film deposition temperature at 420° C. and applying a microwave power of 2.8 kW. The barrier metal layer 22 deposited in this manner functions as a barrier; that is, it prevents the impurity diffusion layer (not shown in the figure) from being destroyed by the aluminum spikes which generate from an Al-based alloy layer (formed in the later step at a region other than the insulating layer 14) inside the opening (not shown in the figure) and which penetrate through the impurity diffusion region.

The base is then transferred inside a sputtering apparatus without exposing it to the atmosphere. In this manner, an Al-based alloy layer 30 is formed by aluminum reflow method on the barrier metal layer 22 at a thickness of 500 nm in average. For instance, an Al-based alloy layer comprising an Al-1%Si alloy can be deposited by sputtering under an atmosphere of 100% argon at a film deposition temperature of 100° C., while controlling the process gas pressure at 0.4 Pa and applying a DC power of 10 kW.

After thus depositing the Al-based alloy layer, the resulting base is transferred into a reflow treatment chamber without disturbing the vacuum state. The Al-based alloy layer can be subjected to reflow treatment by heating the substrate to 450° C. for a duration of 3 minutes from the back side using gas heating while flowing argon at a flow rate of 30 sccm and at a gas pressure of 0.17 Pa.

The method of heating the substrate as employed herein comprises heating the substrate from the back side. More specifically, a heater block is provided on the back side of the substrate is heated to a predetermined temperature (heating temperature), and a process gas is introduced between the heater block and the back side of the substrate. The base can be heated by the gas in this manner. Otherwise, the base can be heated by employing a lamp heating method.

The Al-based alloy layer deposited on the barrier metal layer 22 can thus be fluidized and is allowed to flow into an opening not shown in the figure. Then, the opening can be surely filled with the Al-based alloy. In this manner, an interconnection layer comprising a contact layer 20, a barrier metal layer 22, and an aluminum based alloy layer 30 can be formed on the insulating layer 14 as shown in FIG. 1 (A). The Al-based alloy layer 30 is then planarized by subjecting the resulting structure to reflow treatment. Because the Al-based alloy layer 30 is formed by the aluminum reflow treatment process, the layer can be formed from strongly (111) oriented Al-based alloy crystals as compared with the case in which the Al-based alloy layer 30 is formed by high temperature aluminum sputtering. Hence, an Al-based alloy layer 30 reduced in surface irregularities can be obtained by the process according to the present example.

Figure 3A:
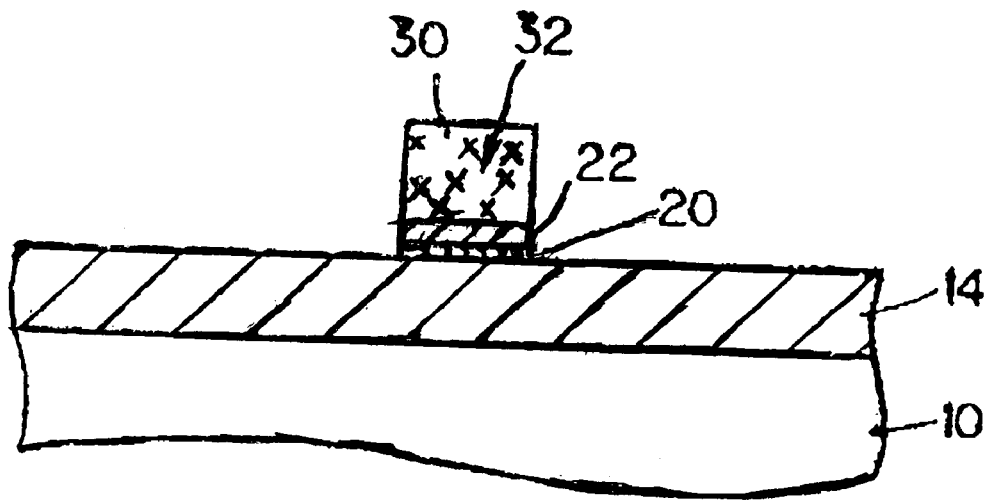
FIGS. 3 (A) and 3 (B) are a schematically drawn diagram provided as an explanatory means to show the step sequential structures of a semiconductor element obtained in the process for fabricating a semiconductor device of Example 1 according to a further other embodiment of the present invention.
Figure 3B:
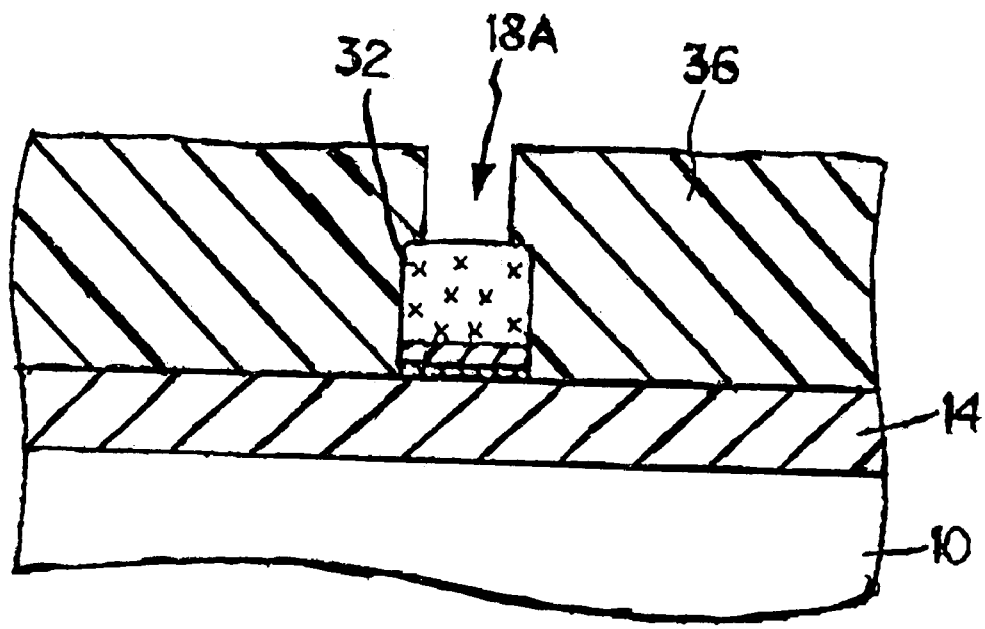

The interconnection layer is patterned thereafter by means of photolithography and dry etching techniques. Thus is obtained a complete interconnection 32 by patterning the interconnection layer into a desired pattern (FIG. 3 (A)). Because an Al-based alloy layer 30 having a smooth surface is obtained, a photoresist mask patterned into a desired shape of interconnection can be readily aligned with high precision. Moreover, halation can be prevented from occurring during the patterning process using photolithography. Referring to FIG. 3 (A), the cross section of the interconnection which is obtained after the reactive ion etching shows that an ordered structure is implemented. Thus, it has been found that the formation of an inter layer insulating layer 36, planarization, and the formation of an opening 16A in the inter layer insulating layer 36 (FIG. 3 (B)) can be carried out under excellent control.

The tilting of the <111> axes L of the Al-based alloy crystals constituting the Al-based alloy layer 30 for an angle up to 5 degrees with respect to the normal $L_N$ of the barrier metal layer 22 formed on the insulating layer 14 can be confirmed by subjecting the structure to electron beam diffraction. The sample for use in the electron beam diffraction must be prepared as such that the electron beam can be incident to the sample along the thickness direction to the base 10. More specifically, in case a base 10 comprising an Si (111) semiconductor substrate is used, the electron beam diffraction pattern of the base 10 must be previously analyzed and confirmed that the Si (111) pattern is surely obtained. The diffraction pattern of the Al-based alloy crystals is analyzed thereafter. The angle θ which the straight line connecting the diffraction spot assigned to Si (111) and the center of the electron beam diffraction pattern makes with respect to the straight line connecting the diffraction spot assigned to the (111) plane of the Al-based alloy crystals and the center of the electron beam diffraction pattern is then measured. If the angle θ falls within a range of from 0 to 5 degrees, it can be safely said that the <111> axes L of the Al-based alloy crystals are inclined by an angle of 0 to 5 degrees with respect to the normal $L_N$ of the barrier metal layer 22 formed on the insulating layer 14.

EXAMPLE 2

Figure 4A:
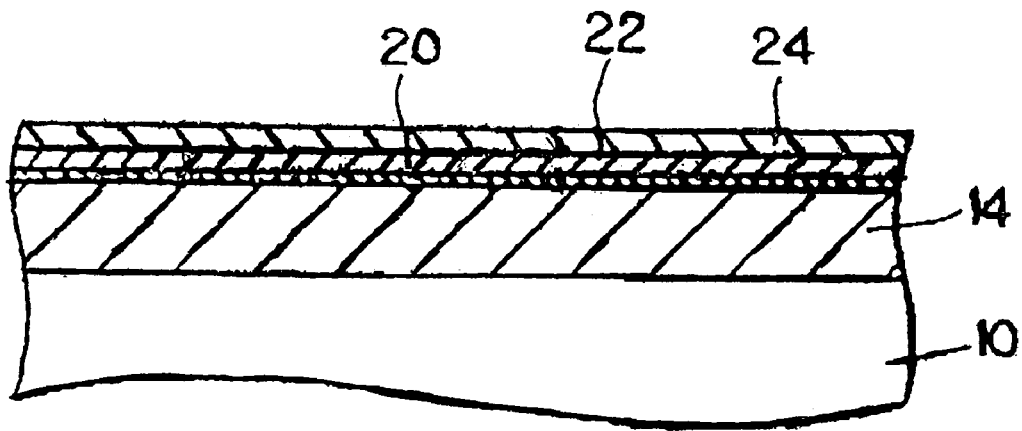
FIGS. 4 (A) and 4 (B) are each schematically drawn partial cross section views of a semiconductor device of Example 2 according to a still other embodiment of the present invention.
Figure 4B:
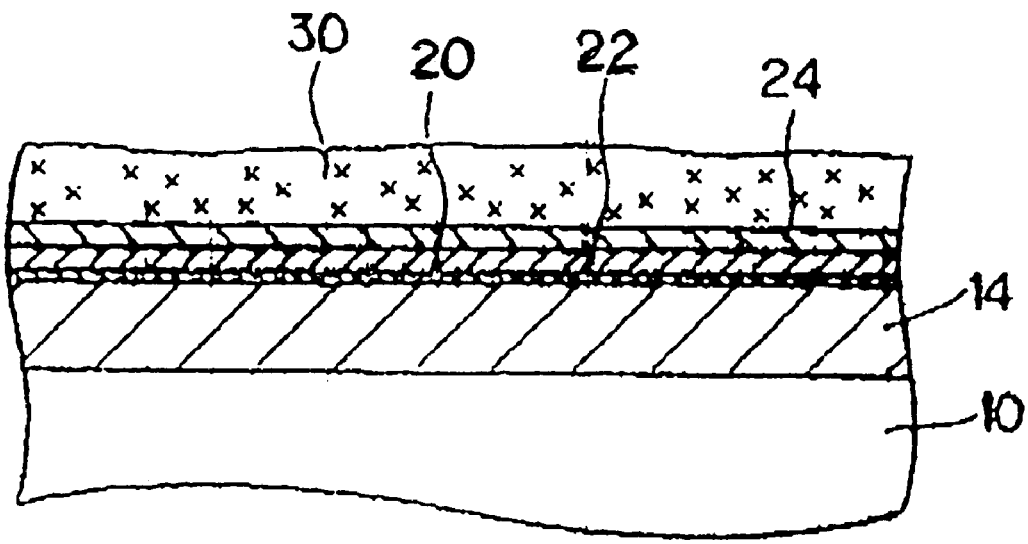
Figure 5A:
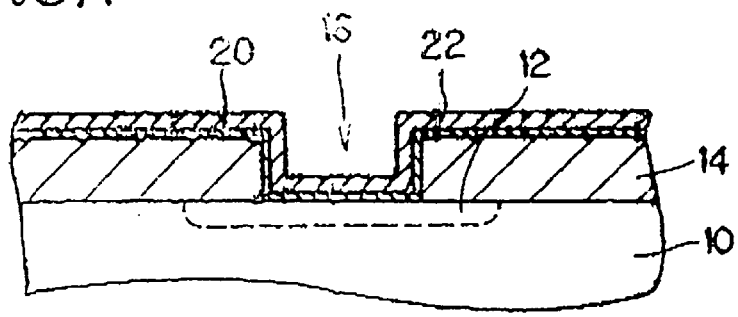
FIGS. 5 (A) to 5 (D) are a schematically drawn diagram provided as an explanatory means to show the step sequential structures of a semiconductor device obtained in the process for fabricating a semiconductor device of Example 4 according to a yet other embodiment of the present invention.
Figure 5B:
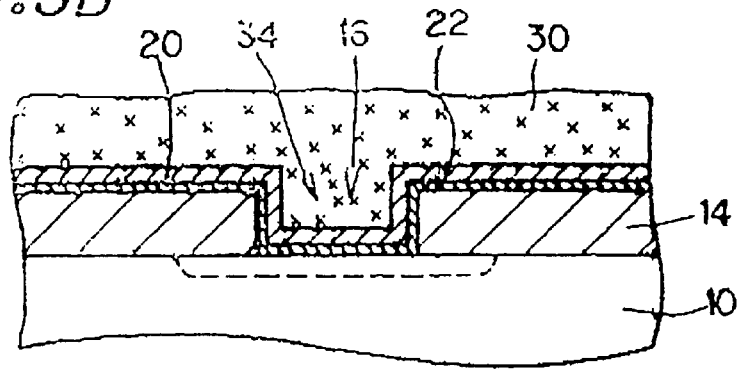
Figure 5C:
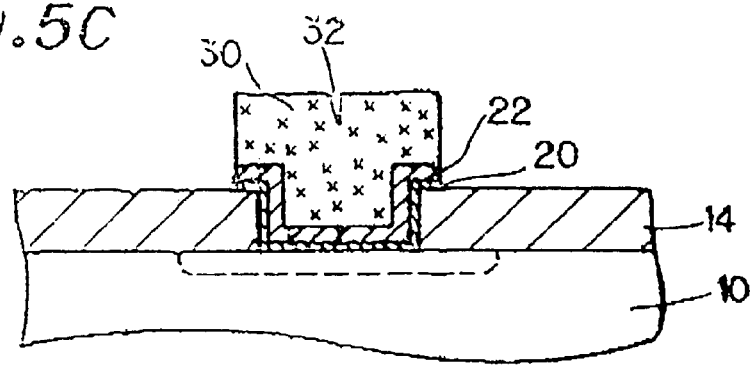
Figure 5D:
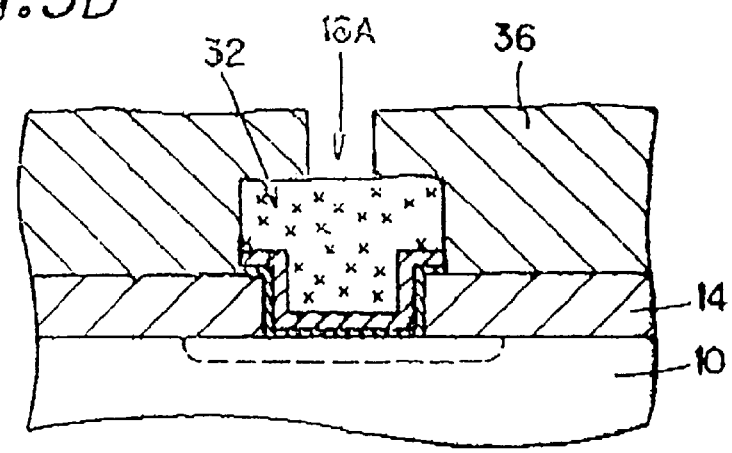

The present example is a modification of Example 1. Referring to the schematically drawn partial cross section view of FIG. 4 (A), a 30 nm thick titanium metallic layer is formed as a wettability improving layer 24 between the barrier metal layer 22 and the Al-based alloy layer 30. The metallic wettability improving layer 24 can be deposited by sputtering, for example, after completing the deposition of the barrier metal layer 22 but before forming the Al-based alloy layer 30 as described in the process with reference to Example 1. The wettability improving layer 24 is formed to improve the wettability of the Al-based alloy layer with the underlying layer. A partial cross section view of a semiconductor element having thereon the Al-based alloy layer 30 is shown schematically in FIG. 4 (B). The titanium wettability improving layer 24 can be formed at a thickness of 30 nm by sputtering under 100% argon gas atmosphere and at a film deposition temperature of 150° C., while controlling the process gas pressure at 1.1 Pa and applying a DC power of 5 kW.

The g-line reflectance of the surface of the Al-based alloy layer 30 thus obtained in Example 2 was found to be about 97%. The observation by means of transmission electron microscopy (TEM) revealed the Al-based alloy layer 30 to have a thickness in the range of from about 450 to 500 nm. This is in good agreement with the designed thickness of 500 nm. It can be seen therefrom that an Al-based alloy layer having small surface roughness is obtained. The orientation of the Al-based alloy crystals constituting the Al-based alloy layer 30 was measured by electron beam diffraction. The orientation of the crystallographic axes was measured at 6 points. It was found that all of the measured tilting angles of the crystallographic <111> axes L fall within an angle of 5 degrees with respect to the normal $L_N$ of the barrier metal layer 22 provided on the insulating layer 14.

For comparison, the surface characteristics of an Al-based alloy layer 30 was evaluated in the same manner as described in Example 2 except for depositing the Al-based alloy 30 by high temperature aluminum sputtering at 300° C. The g-line reflectance of the resulting Al-based alloy layer was found to be about 4%. Furthermore, the thickness obtained by TEM observation varied over a range of from about 400 to 700 nm. This fluctuation is considerably large as compared with the designed thickness of 500 nm. These results clearly show that the Al-based alloy layer obtained in this case has a greatly roughened surface. Furthermore, the orientation of the crystallographic axes of the Al-based alloy crystals constituting the Al-based alloy layer 30 was measured by means of electron beam diffraction. In the 10 sample points measured, only one point was found to yield a tilting angle of the crystallographic <111> axis L falling within an angle of 5 degrees with respect to the normal $L_N$ of the barrier metal layer 22 provided on the insulating layer 14.

EXAMPLE 3

The present example is another modification of Example 1. Thus, the same process as that described in Example 1 is employed, except for forming the barrier metal layer by thermal CVD and for forming a titanium contact layer by sputtering before depositing the barrier metal layer. Because the use of a thermal CVD excludes the formation of a titanium contact layer, sputtering process is employed in the present case. The step sequential cross section structures of the semiconductor element are essentially the same as those in FIGS. 1 (A) and 1 (B), FIGS. 2 (A) to 2 (C), and FIGS. 3 (A) and 3 (B). Thus, the process of the present example is described below with reference to the figures enumerated above.

A 0.7 μm thick $SiO_2$ film is formed as an insulating layer 14 by an ordinary CVD process on a base 10 made of a Si (111) semiconductor substrate (FIG. 2 (A)).

A 30 nm thick titanium contact layer 20 is preferably deposited thereafter by sputtering on the insulating layer 14 (FIG. 2 (B)). The contact layer 20 is deposited at a thickness of 30 nm by sputtering under 100% argon gas atmosphere and at a film deposition temperature of 150° C., while controlling the process gas pressure at 1.1 Pa and applying a DC power of 5 kW.

Subsequently, a 40 nm thick TiN barrier metal layer 22 is deposited by thermal CVD on the contact layer 20 without exposing the base to the atmosphere (FIG. 2 (C)). The barrier metal layer 22 can be deposited by effecting the thermal CVD process using a mixture of gaseous $TiCl_4$ and $NH_3$ in which the former and the latter are flown at a rate of 80 sccm and 300 sccm, respectively, while maintaining the film deposition temperature at 650° C. and the pressure at 67 Pa.

The base is then transferred inside a sputtering apparatus without exposing it to the atmosphere. In this manner, an Al-based alloy layer 30 is formed at a thickness of 500 nm in average by aluminum reflow method on the barrier metal layer 22. After thus depositing the Al-based alloy layer, the resulting base is transferred into a reflow treatment chamber without disturbing the vacuum state. This step can be effected in the same manner as that described in Example 1. Thus is obtained a structure as shown in FIGS. 1 (A) and 1 (B).

The interconnection layer is patterned thereafter by means of photolithography and dry etching techniques. Thus is obtained a complete interconnection 32 by patterning the interconnection layer into a desired pattern (FIG. 3 (A)).

EXAMPLE 4

The present example refers to a semiconductor device according to another embodiment of the present invention, and to a process for fabricating a semiconductor device according to a still other embodiment of the present invention. The present example differs from Examples 1 to 3 in that an opening is provided in the insulating layer.

In the present example, the barrier metal layer is formed by ECR plasma-assisted CVD in the same manner as in the process described in Example 1. The process according to the present example further comprises forming a titanium contact layer by ECR plasma-assisted CVD before depositing the barrier metal layer.

Referring to the schematically drawn cross section view of FIG. 5 (A), the semiconductor device according to the present Example comprises a base 10 having thereon an insulating layer 14, an opening 16 formed in the insulating layer 14, a TiN barrier metal layer 22 formed on the insulating layer 14 and the inside of the opening 16, and an Al-based alloy layer 30 formed on the barrier metal layer. Furthermore, as shown in FIG. 1 (B), it can be seen that the crystallographic <111> axes L of the Al-based alloy crystals constituting the Al-based alloy layer 30 make an angle in the range of from 0 to 5 degrees with respect to the normal $L_N$ of the barrier metal layer 22 formed on the insulating layer 14. Referring to FIG. 5, an impurity diffusion region 12 and a titanium contact layer 20 are provided to the base 10.

Referring to FIG. 5, the process for fabricating the the semiconductor device according to the present example is described below.

Source and drain region (impurity diffusion region) 12 is formed on a base comprising an Si (111) semiconductor substrate by a conventional ion implantation process. Then, a 0.7 μm thick $SiO_2$ film is formed as an insulating layer 14 by an ordinary CVD process on the resulting base 10. An opening 16 is provided by photolithography and dry etching techniques to the upper portion of the source and drain region 12 in the insulating layer 14.

A 5 nm thick titanium contact layer 20 is preferably deposited thereafter by ECR plasma-assisted CVD on the insulating layer 14. The contact layer 20 may be deposited under the same conditions as those described in Example 1. The contact layer 20 deposited in this manner reduces the contact resistance between the Al-based alloy layer, which is formed in the later step inside the opening 16, and the source and drain region (the impurity diffusion region) 12.

Figure 6A:
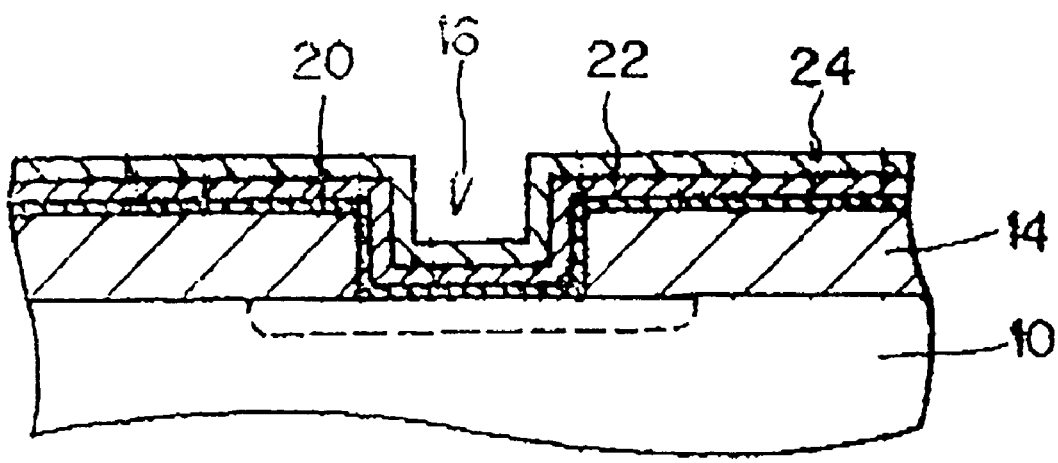
FIGS. 6 (A) and 6 (B) are a schematically drawn diagram provided as an explanatory means to show the step sequential structures of a semiconductor device obtained in the process for fabricating a semiconductor device of Example 5 according to a still other embodiment of the present invention.
Figure 6B:
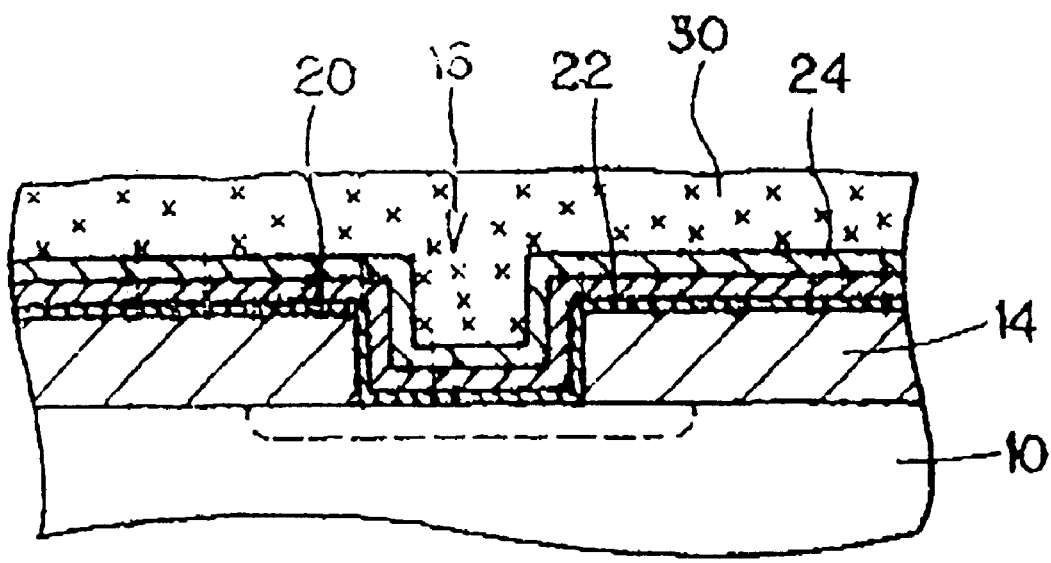
Figure 7A:
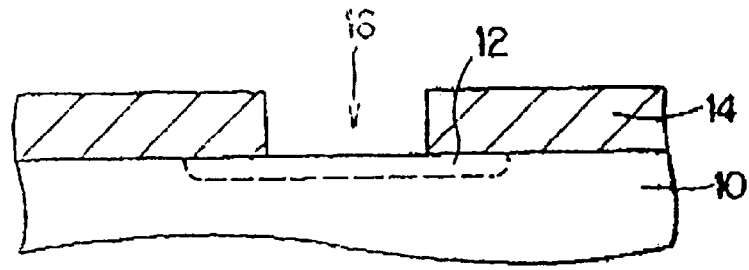
FIGS. 7 (A) to 7 (C) are a schematically drawn diagram to show the step sequential structures of a semiconductor device obtained in the conventional high temperature aluminum sputtering process.
Figure 7B:
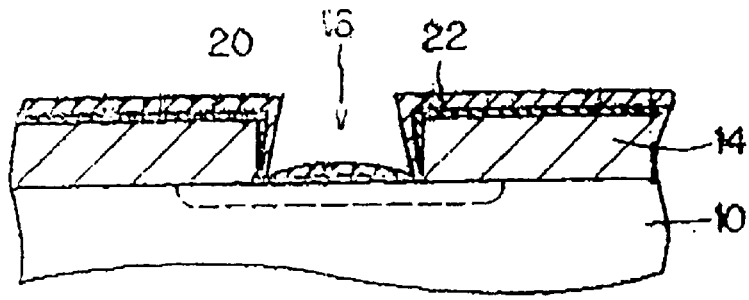
Figure 7C:
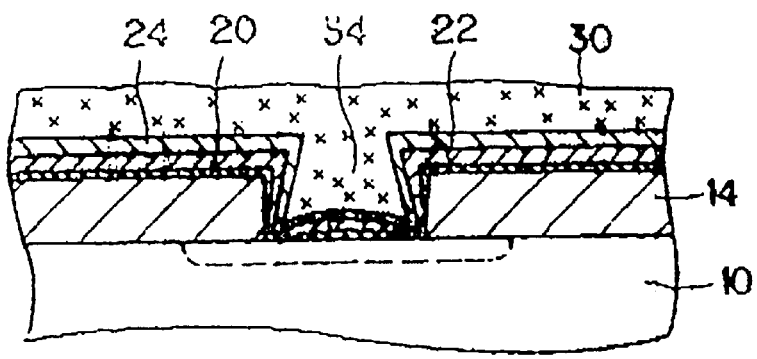
Figure 8:
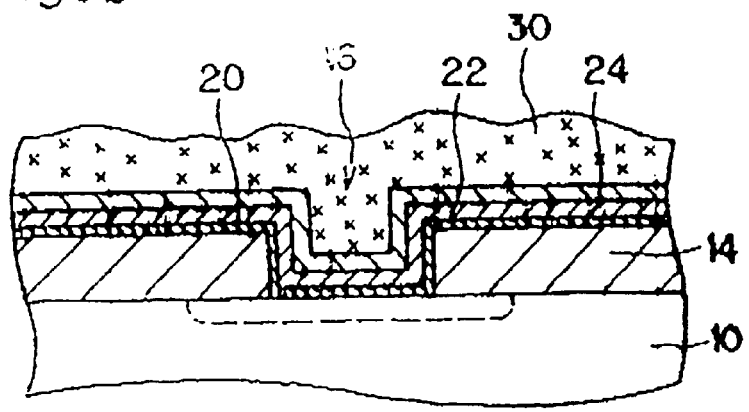
FIG. 8 is a schematically drawn partial cross section view of a semiconductor device showing the surface-roughened (surface irregularities) of an aluminum based alloy layer.

Subsequently, a 40 nm thick TiN barrier metal layer 22 is deposited by ECR plasma-assisted CVD on the contact layer 20 without exposing the base to the atmosphere (FIG. 6 (A)). The barrier metal layer 22 can be deposited by effecting the ECR plasma-assisted CVD in the same manner as in the step for forming the TiN barrier metal layer 22 in Example 1. The barrier metal layer 22 deposited in this manner functions as a barrier; that is, it prevents the source and drain region 12 from being destroyed by the aluminum spikes which generate from the Al-based alloy layer (to be formed in the later step) and which penetrate through the source and drain region.

The base is then transferred inside a sputtering apparatus without exposing it to the atmosphere. In this manner, an Al-based alloy layer 30 is formed by aluminum reflow treatment on the barrier metal layer 22 at an average thickness of 500 nm. For instance, an Al-based alloy layer comprising an Al-1%Si alloy can be deposited by sputtering under the same conditions as those employed in the reflow treatment described in Example 1.

The Al-based alloy layer deposited on the barrier metal layer 22 can thus be fluidized and is allowed to flow into the opening 16. Accordingly, the opening 16 can be surely filled with the Al-based alloy. In this manner, an interconnection layer comprising a contact layer 20, a barrier metal layer 22, and an aluminum based alloy layer 30 can be formed on the insulating layer 14 as shown in FIG. 5 (B). The opening 16 can be thus filled with the contact layer 20, the barrier metal layer 22, and the Al-based alloy layer 30 to establish a connection hole (contact hole) 34. Because the Al-based alloy layer 30 is formed by the aluminum reflow treatment, the layer can be established from strongly (111) oriented Al-based alloy crystals as compared with the case in which the Al-based alloy layer 30 is formed by high temperature aluminum sputtering. Hence, an Al-based alloy layer 30 reduced in surface irregularities can be obtained by the process according to the present example.

The interconnection layer is patterned thereafter by means of photolithography and dry etching techniques. Thus is obtained a complete interconnection 32 by patterning the interconnection layer into a desired pattern (FIG. 5 (C)). Because an Al-based alloy layer 30 having a smooth surface is obtained, a photoresist mask patterned into a desired shape of interconnection can be readily aligned with the resist layer at high precision. Moreover, halation can be prevented from occurring during the patterning process using photolithography. Referring to FIG. 5 (C), the cross section of the interconnection after the reactive ion etching shows that an ordered structure is implemented. Thus, it has been found that the formation of an inter layer insulating layer 36, planarization, and the formation of an opening 16A in the inter layer insulating layer 36 (FIG. 5 (D)) can be carried out under excellent control.

EXAMPLE 5

The present example is a modification of Example 4. Referring to the schematically drawn partial cross section view of FIG. 6 (A), a 30 nm thick titanium metallic layer is formed as a wettability improving layer 24 between the barrier metal layer 22 and the Al-based alloy layer 30. The metallic wettability improving layer 24 can be deposited by sputtering, for example, after completing the deposition of the barrier metal layer 22 but before forming the Al-based alloy layer 30 as described in the process with reference to Example 4. The wettability improving layer 24 is formed for improving the wettability of the Al-based alloy layer with the underlying layer. A partial cross section view of a semiconductor element having thereon the Al-based alloy layer 30 is shown schematically in FIG. 6 (B). The titanium wettability improving layer 24 can be formed by sputtering under the same conditions as those employed in Example 2.

The process described in Example 3 can be combined with that employed in Example 4. More specifically, the step comprising depositing a titanium contact layer by sputtering before forming the barrier metallic layer (which reference should be made to the step described in Example 3) together with the step of forming the barrier metallic layer by thermal CVD (which also is a step described in Example 3) can be used to replace the corresponding step in the process of Example 4. The cross section structures obtained in the combined process are the same as those in the corresponding steps described previously with reference to FIGS. 5 (A) to 5 (D). The detailed description of the individual steps is therefore omitted.

The present invention has been described in detail by making reference to preferred embodiments above, however, it should be understood that the present invention is not only limited thereto. The film deposition conditions and the specified values are provided as mere examples, and they can be modified properly. The insulating layer 14 can be made not only from $SiO_2$, and other known insulating materials such as borophosphate silicate glass (BPSG), phosphosilicate glass (PSG), borosilicate glass (BSG), arsenic silicate glass (AsSG), lead silicate glass (PbSG), antimony silicate glass (SbSG), silicon oxide glass (SOG), silicon oxinitride (SiON), or silicon nitride (SiN) are also usable. Otherwise, a laminate of the above enumerated insulating materials can be used as well. The aluminum based alloy layer 30 can be fabricated from pure aluminum or an aluminum alloy such as an Al—Si—Cu alloy, an Al—Cu alloy, or an Al—Ge alloy.

The base may be a silicon semiconductor substrate or a semiconductor substrate fabricated thereon a source and drain region. Also usable are a MgO substrate, a GaAs substrate, a superconductive transistor substrate, an insulating layer formed thereon a lower interconnection layer, an element portion such as a gate electrode in which a connection hole (e.g., a contact hole, a via hole, or a through hole) is formed to establish an electric connection, or a silicon layer and the like formed on a substrate of any type for fabricating a thin film transistor. Furthermore, the process according to the present invention is applicable to other semiconductor devices (e.g., a bipolar transistor and a charge coupled device (CCD)) other than a MOS semiconductor device.

The sputtering process in the present invention can be effected by means of, for example, a magnetron sputtering apparatus, a DC sputtering apparatus, an RF sputtering apparatus, an ECR sputtering apparatus, or a bias sputtering apparatus which applies a substrate bias. Furthermore, the metallic wettability improving layer 24 can be deposited by ECR plasma-assisted CVD instead of carrying out a sputtering process.

As described in the foregoing, the barrier metal layer based on TiN according to the present invention can be formed conformal with respect to the bottom plane of the opening. The present invention is therefore suitable for openings having a high aspect ratio because the barrier metal layer can be formed with excellent coverage on the bottom plane of the openings. Thus, the present invention suppresses the generation of, for example, the junction leak current in contact holes. Furthermore, an aluminum based alloy layer reduced in surface roughness can be fabricated by combining the process of forming the barrier metal layer above with the aluminum reflow method.

Because the aluminum based alloy layer is thus obtained with a smooth surface, a photoresist mask patterned into a desired shape of interconnection can be readily aligned with the resist layer at high precision. Furthermore, halation can be prevented from occurring during the patterning process using photolithography. It has been found also that the formation of an interlayer insulating layer after establishing the interconnection layer, planarization, and the formation of an opening in the interlayer insulating layer can be carried out under excellent control. Moreover, the resistances of the interconnection against electromigration and stress migration can be improved as to result in superior interconnection reliability.

While the invention has been described in detail and with reference to specific embodiments thereof, it will be apparent to one skilled in the art that various changes and modifications can be made therein without departing from the spirit and scope thereof.

What is claimed is:

1. A semiconductor device, comprising:

an insulating layer formed on a semiconductor body;

a barrier metal layer comprising titanium nitride formed on the insulating layer, said titanium nitride having a crystal orientation of <200>; and an aluminum based alloy layer formed on the barrier metal layer, wherein the aluminum based alloy crystals constituting the aluminum based alloy layer have a crystallographic <111> axis thereof inclined by an angle of from 0 to 5 degrees with respect to a normal of the barrier metal layer on the insulating layer.

2. A semiconductor device as claimed in claim 1, wherein, the insulating layer comprises an opening to partly expose the surface of the semiconductor body, and the barrier metal layer is formed on the insulating layer and inside the opening.

3. A semiconductor device as claimed in claim 1, further comprising a contact layer of titanium formed between the insulating layer and the barrier metal layer.

4. A semiconductor device as claimed in claim 1, further comprising a metallic layer of titanium formed between the barrier metal layer and the aluminum based alloy layer.

5. A semiconductor device as claimed in claim 3, further comprising a metallic layer of titanium formed between the barrier metal layer and the aluminum based alloy layer.

6. A semiconductor device as claimed in claim 1, wherein, the barrier metal layer is fabricated by chemical vapor deposition.

* * * * *